United States Patent
Di Francesco et al.

(10) Patent No.: US 12,431,197 B2
(45) Date of Patent: *Sep. 30, 2025

(54) PROGRAMMING OPERATION USING CACHE REGISTER RELEASE IN A MEMORY SUB-SYSTEM

(71) Applicant: Micron Technology, Inc., Boise, ID (US)

(72) Inventors: Walter Di Francesco, Avezzano (IT); Violante Moschiano, Avezzano (IT); Umberto Siciliani, Rubano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,282

(22) Filed: Jan. 4, 2024

(65) Prior Publication Data
US 2024/0203501 A1  Jun. 20, 2024

Related U.S. Application Data

(63) Continuation of application No. 17/675,526, filed on Feb. 18, 2022, now Pat. No. 11,908,523.

(60) Provisional application No. 63/239,720, filed on Sep. 1, 2021.

(51) Int. Cl.
| | | |
|---|---|---|
| *G11C 16/10* | (2006.01) | |
| *G06F 12/0802* | (2016.01) | |
| *G11C 16/04* | (2006.01) | |
| *G11C 11/56* | (2006.01) | |

(52) U.S. Cl.
CPC .......... *G11C 16/10* (2013.01); *G06F 12/0802* (2013.01); *G11C 16/0483* (2013.01); *G06F 2212/60* (2013.01); *G06F 2212/72* (2013.01); *G11C 11/56* (2013.01)

(58) Field of Classification Search
CPC ..... G11C 16/10; G11C 16/0483; G11C 11/56; G11C 16/32; G11C 2211/5643; G11C 11/5628; G11C 16/3459; G06F 12/0802; G06F 2212/60; G06F 2212/72;
(Continued)

(56) References Cited

U.S. PATENT DOCUMENTS

| | | | |
|---|---|---|---|
| 6,651,032 B2* | 11/2003 | Peterson .............. | G11C 11/5642 365/201 |
| 8,176,208 B2* | 5/2012 | Shishido .............. | G06F 11/3055 710/3 |
| 11,908,523 B2* | 2/2024 | Di Francesco .... | G11C 16/3459 |

(Continued)

FOREIGN PATENT DOCUMENTS

CN 101137968 A * 3/2008 ......... G06F 12/0802

OTHER PUBLICATIONS

Notice of Allowance for U.S. Appl. No. 17/675,526, mailed Oct. 10, 2023, 7 Pages.

*Primary Examiner* — Fernando Hidalgo
(74) *Attorney, Agent, or Firm* — Lowenstein Sandler LLP

(57) ABSTRACT

Control logic in a memory device initiates a programming operation to program a set of memory cells of the memory device to a target programming level of a set of programming levels. During execution of the programming operation, a programming status associated with the set of memory cells. In response to determining the programming status satisfies a condition, causing a release of a set of data associated with the programming operation from a cache register.

20 Claims, 10 Drawing Sheets

(58) Field of Classification Search
CPC ..... G06F 2212/1016; G06F 2212/1032; G06F 2212/7203; G06F 12/0215; G06F 12/0246
USPC .................................................. 365/185.03
See application file for complete search history.

(56) References Cited

U.S. PATENT DOCUMENTS

2008/0043535 A1* 2/2008 Roohparvar ............. G11C 8/10
365/185.19
2021/0073291 A1 3/2021 Hunter

* cited by examiner

| 350₀ | 350₁ | 350₂ | 350₃ |
|---|---|---|---|
| Block₀ 250₀ | Block₀ 250₀ | Block₀ 250₀ | Block₀ 250₀ |
| Block₁ 250₁ | Block₁ 250₁ | Block₁ 250₁ | Block₁ 250₁ |
| Block₂ 250₂ | Block₂ 250₂ | Block₂ 250₂ | Block₂ 250₂ |
| Block₃ 250₃ | Block₃ 250₃ | Block₃ 250₃ | Block₃ 250₃ |
| Block₄ 250₄ | Block₄ 250₄ | Block₄ 250₄ | Block₄ 250₄ |
| ⋮ | ⋮ | ⋮ | ⋮ |
| Block_{L-4} 250_{L-4} | Block_{L-4} 250_{L-4} | Block_{L-4} 250_{L-4} | Block_{L-4} 250_{L-4} |
| Block_{L-3} 250_{L-3} | Block_{L-3} 250_{L-3} | Block_{L-3} 250_{L-3} | Block_{L-3} 250_{L-3} |
| Block_{L-2} 250_{L-2} | Block_{L-2} 250_{L-2} | Block_{L-2} 250_{L-2} | Block_{L-2} 250_{L-2} |
| Block_{L-1} 250_{L-1} | Block_{L-1} 250_{L-1} | Block_{L-1} 250_{L-1} | Block_{L-1} 250_{L-1} |
| Block_L 250_L | Block_L 250_L | Block_L 250_L | Block_L 250_L |
| 240₀ | 240₁ | 240₂ | 240₃ |

FIG. 3

PROGRAMMING OPERATION USING CACHE REGISTER RELEASE IN A MEMORY SUB-SYSTEM

CROSS-REFERENCE TO RELATED APPLICATION

This is a continuation of U.S. patent application Ser. No. 17/675,526, titled "Express Programming Using Advanced Cache Register Release in a Memory Sub-system", filed on Feb. 18, 2022, which in turn claims the benefit of U.S. Provisional Application No. 63/239,720, titled "Express Programming Using Advanced Cache Register Release in a Memory Sub-system," filed Sep. 1, 2021. The entire disclosures of U.S. patent application Ser. No. 17/675,526 and U.S. Provisional Application No. 63/239,720 are incorporated herein by reference.

TECHNICAL FIELD

Embodiments of the disclosure relate generally to memory sub-systems, and more specifically, relate to express programming using advanced cache register release in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B, in accordance with one or more embodiments of the present disclosure.

DETAILED DESCRIPTION

Figure 1A:
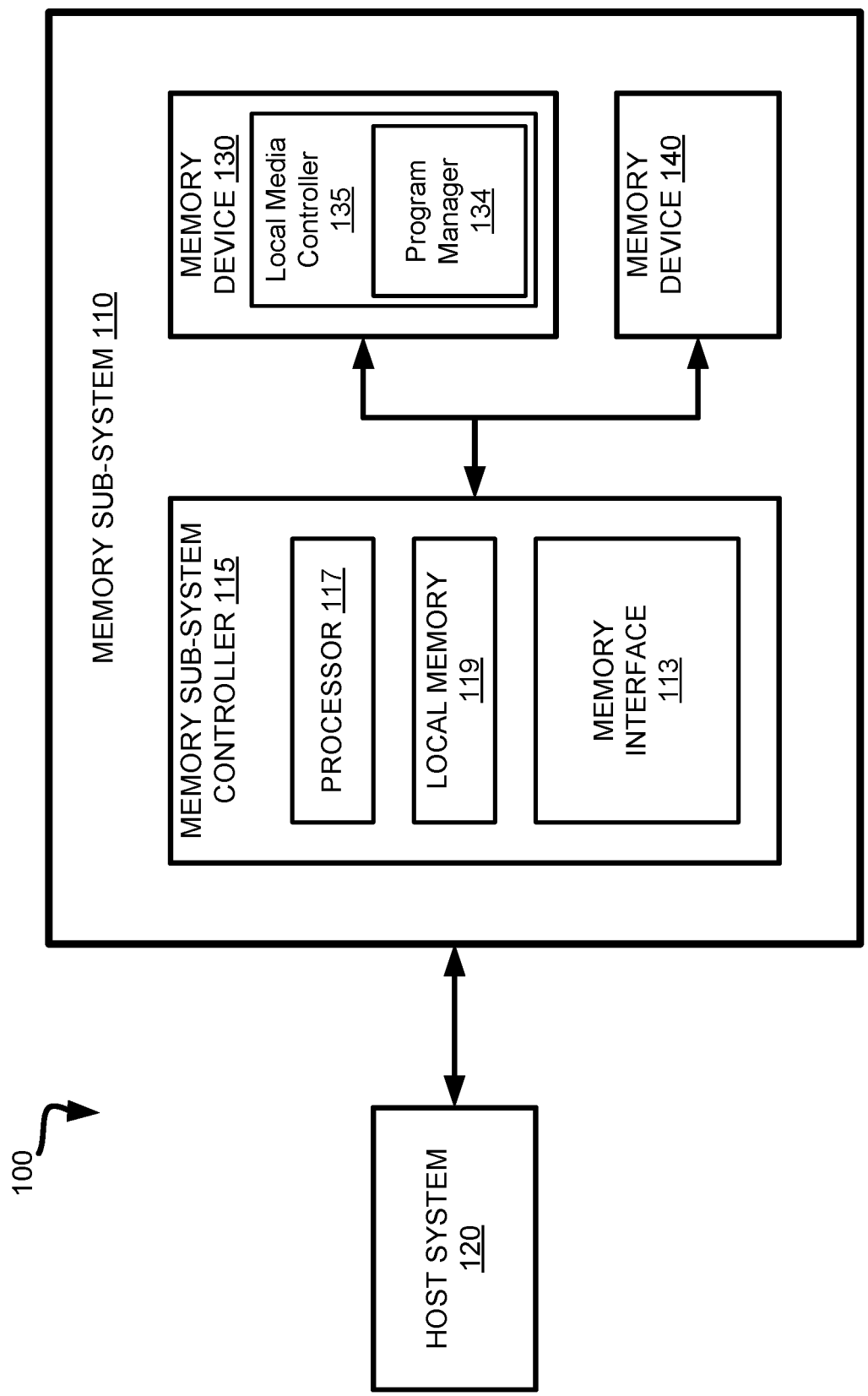
FIG. 1A illustrates an example computing system that includes a memory sub-system, in accordance with some embodiments.

Aspects of the present disclosure are directed to express programming of memory cells of a memory array of a memory device in a memory sub-system with a reduced programming time using an advanced cache register release operation. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory cells are etched on a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a word line group, a word line, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means word lines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with the application of a programming voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., successive pulses increasing by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level (Vwi) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage programming pulses are applied to the selected wordline to increase a charge level, and thereby a threshold voltage, of certain memory cells connected to that wordline. After each programming pulse, or after a number of programming pulses, a program verify operation is performed to determine if the threshold voltage of the one or more memory cells has increased to a desired programming level. For example, the programming pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

According to this approach, the series of programming pulses and program verify operations are applied to program each programming level (e.g., programming levels L1 to L7 for a TLC memory cell) in sequence. For example, this approach sequentially programs the levels of the memory cell (e.g., L1 to L7) by applying a first set of pulses to program level L1 cells to a first target voltage level, followed by the application of a second set of pulses to program level L2 cells to a second target voltage level, and so on until the cells at all of the levels are programmed.

In this approach, each level may require multiple programming pulses and program verify operations to reach the target programming voltage associated with the respective programming level. Accordingly, this results in a long time to program (e.g., a time from an initial programming pulse until the program verify threshold voltage is reached, also referred to as "Tprog") associated with the one or more memory cells. For example, programming each level of a TLC memory cell (e.g., programming levels L1 to L7) one at a time requires a high number of total programming pulses (e.g., approximately 24 pulses) and a high number of associated program verify operations (e.g., approximately 42 program verify operations). In this example, if a time associated with each pulse is 37.5 μs, then a total time for the set of pulses (i.e., 24 pulses) may be approximately 900 μs. In addition, the time associated with performing the program verify operations can add an additional 900 μs, resulting in a total program time (Tprog) of, for example, 1800 μs.

During the execution of the programming algorithm, a system controller detects the completion of a program cycle by monitoring a ready/busy (RB) pin of the status register to detect a ready/busy signal representing a ready/busy status of a cache register in a page buffer of the memory device (also referred to as an "RB signal"). The ready/busy signal can have a first value (e.g., "0") representing a busy status indicating that the cache register is busy in view of an in-progress or in-progress memory access operation and unable to accept new data. When the cache register has the busy status, new data associated with a next memory access operation (e.g., a next programming operation) must wait and cannot be loaded into the cache register. Upon completion of the programming algorithm, the cache register is released such that data stored in the cache register is released (i.e., removed or deleted) and the ready/busy signal is updated to a second value (e.g., "1") representing a ready status indicating the cache register is ready to accept new data (e.g., data associated with a next memory access operation).

Typically, the cache register is released after completion of both the programming phase (i.e., application of all of the programming loops) including a final programming pulse (also referred to as "programming pulse N", where N is a total number of programming pulses in the programming operation) and a voltage discharge phase where the internal voltages are discharged. Accordingly, the ready/busy signal maintains a busy status until the entire programming algorithm is completed, thereby preventing new data associated with a next memory access operation from to be loaded into the cache register.

Some systems employ a cache program operation to improve bus efficiency. The cache program operation uses a page-sized cache register to program pages of data within a block. The cache program operation allows the data associated with a program operation (i.e., the data to be programmed to the pages of the memory device) to be inserted into the cache register while the data register is copied into the memory array. The cache program operation includes multiple data input breakpoints at which the data can be inputted to the memory pages. Using a cache program operation, initially data is copied into the cache register. At a checkpoint, the data is transferred to the data register. The page data is then programmed from the data register into the memory array when the RB output returns to the ready (high) state. When the RB output returns to the ready state, another command can be issued to write new data to the cache register. However, in so doing, the new data is committed to the memory array before the status of the programming (e.g., the verification status) of the previous data set is known or established. Therefore, when a failure occurs with respect to the programming of a later memory page, the data corresponding to prior pages has already been committed and the previous data has been overwritten in the cache register, resulting in data recovery issues and degraded performance.

According to a typical programming algorithm, at some time prior to the completion of the before the end of the programming operation (e.g., 50 μs to 100 μs), the memory cells have substantially reached a final placement within the target programming distribution and the status of the programming operation is established (e.g., it is known or established whether the memory cell has either passed programming or failed programming as determined by a program verify operation). Following this time, one or more further programming pulses including a final programming pulse ($PP_N$) are applied and a voltage discharge phase is performed to discharge all internal voltages to prepare for the next memory access operation. However, even though the status of the programming is substantially known or established prior to the completion of the programming cycle, the cache register is not released until after the completion of all of the programming loops including a final programming pulse (also referred to as "programming pulse N", where N is a total number of programming pulses in the programming cycle) and the voltage discharge phase. Therefore, a longer programming time associated with a current programming operation results and the release of the cache register following completion of the entire current programming operation prevents new data associated with a next programming operation to be stored in the cache register.

Aspects of the present disclosure relate to a programming operation including the advanced or early release of a cache register (also referred to as an "express programming operation") in response to satisfaction of a condition (also referred to as a "prediction condition") associated with a prediction operation associated with a current or in-progress programming operation. In an embodiment, the prediction operation (e.g., a predictive Count Fail Byte (CFBYTE) operation) is performed to generate a prediction result indicating a predicted status of the current programming operation (e.g., a pass or fail status associated with the respective memory cells being programmed). In an embodiment, the prediction condition is satisfied if a prediction level associated with the current programming operation reaches or exceeds a threshold level. In an embodiment, the prediction level or prediction result represents a predicted level or amount of memory cells that would pass or fail program verification in a current programming loop (e.g., a programming pulse and one or more program verify operations). In an embodiment, upon satisfaction of the prediction condition (i.e., the predicted status of an amount of memory cells being programmed by the current programming operation is above the threshold level), an advanced cache register release is executed. In an embodiment, the advanced cache register release includes the releasing or removing of the set of data associated with the current programming operation from the cache register and the updating of the ready/busy signal from the busy signal value (i.e., busy status) to the ready signal value (i.e., ready status) and the associated cache register is released, such that new data associated with a next memory access command can be stored in the cache register.

Advantageously, the express programming operation of the present disclosure includes the use of the prediction condition to cause the release of the cache register prior to the completion of the current or in-progress programming operation. The advanced release of the cache register (i.e., prior to the completion of the one or more last programming pulses and voltage discharge phase) achieves a reduced programming time as compared to typical programming algorithms. In addition, upon the advanced release of the cache register, new data corresponding to a next programming operation can be stored in the cache register, such that the next programming operation can be initiated and executed while the previous programming operation completes. The next programming operation can be initiated and executed in parallel with an in-progress programming operation following the advanced release of the cache register. Accordingly, bus efficiency is improved since the new command associated with a next programming operation can be issued and new data can be stored in the cache register in parallel with the completion of the remaining programming and voltage discharge phases of the previous programming operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Figure 1B:
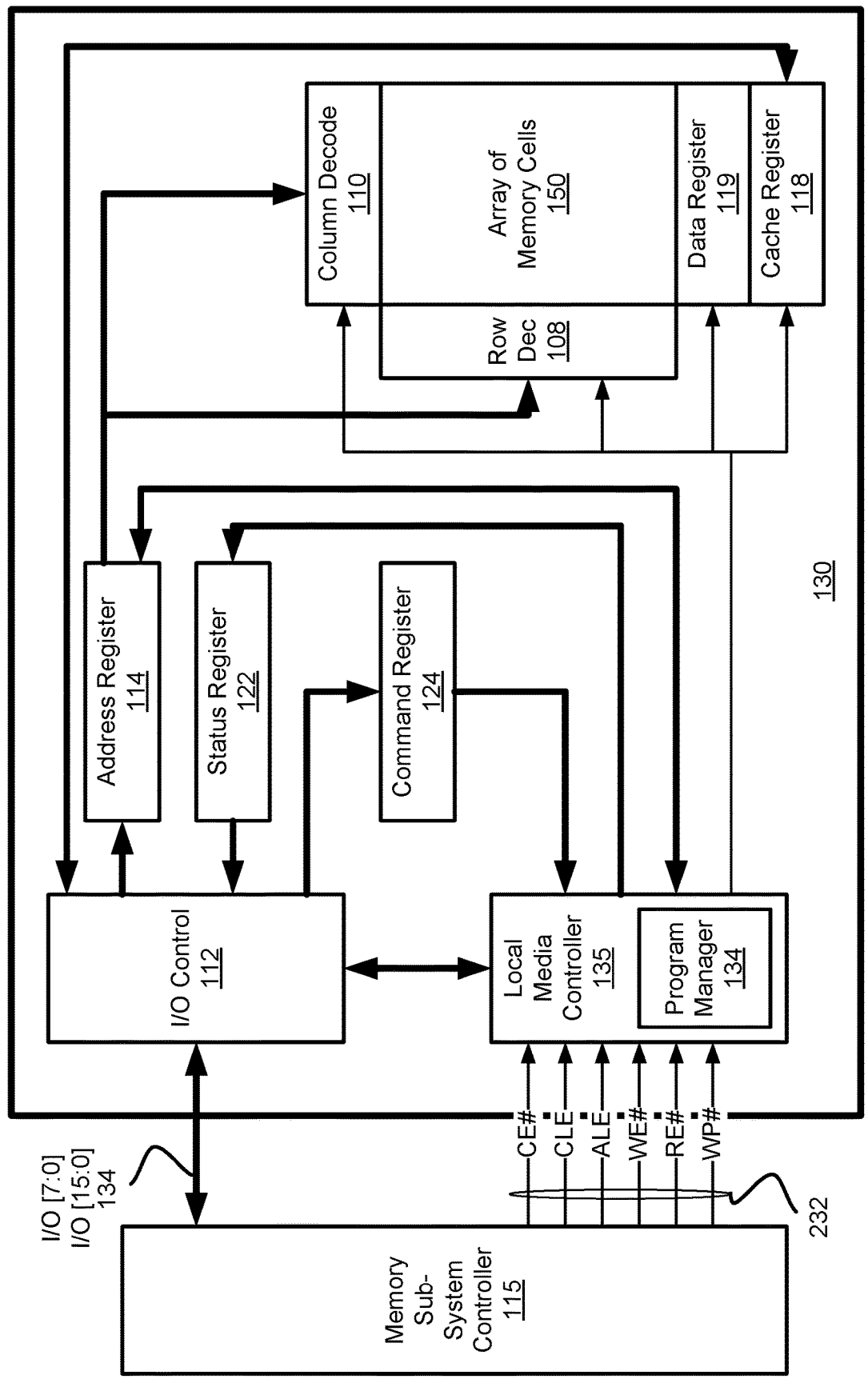
FIG. 1B is a block diagram of a memory device in communication with a memory sub-system controller of a memory sub-system, in accordance with one or more embodiments of the present disclosure.

In one embodiment, program manager 134 can receive data to be programmed to the memory device 130 (e.g., a TLC memory device) and store the data in a cache register (e.g., cache register 118 as illustrated in FIG. 1B). Accordingly, program manager 134 can execute an express programming operation to program a set of memory cells of the array of memory ells 150 of the memory device 130, 140 where the cache register is released (i.e., the cache register is emptied and able to receive and store new data associated with a next programming operation and the ready/busy signal is updated to a ready signal value) in response to the satisfaction of a condition associated with a prediction operation. At one or more checkpoints during an in-progress or current programming operation, the prediction operation is executed to generate a prediction result representing a level (e.g., a number, quantity, percentage, etc.) of the set of memory cells that are predicted to pass or fail program verification in a next or current programming loop based on information associated with a previous programming loop. Program manager 134 checks to determine whether the condition is satisfied by comparing the prediction result to a threshold level. In an embodiment, the condition is satisfied when the prediction result (e.g., a level of memory cells that are predicted to pass or fail verification in a next programming loop) is greater than or equal to the threshold level. In an embodiment, the threshold level can be established to achieve a programming prediction that satisfies a target or desired bit error rate (BER) or other reliability metric. In an embodiment, program manager 134 can tune or adjust the threshold level to have a first level (e.g., threshold level X) corresponding to a first BER level. In this embodiment, program manager 134 can determine the prediction condition using the first level is satisfied approximately at a time following a completion of a last or final program verify operation but before a final programming pulse and the voltage discharge stage (e.g., approximately 50 μs before the completion of the programming operation). Advantageously, the use of the express programming operation including the advanced or early release of the cache register in response to the prediction condition using the first threshold level can result in a reduction in the programming time of approximately 50 μs.

In an embodiment, the program manager 134 can tune the threshold level to have a different threshold level (e.g., threshold level Y) corresponding to a second BER level. In this embodiment, the program manager 134 can determine satisfaction of the prediction condition using the second level at approximately a time following completion of programming loop N−1 for a programming operation having a total of N programming loops. In this embodiment, the early release of the cache register (e.g., upon satisfaction of the prediction condition based on threshold level Y) results in an approximately reduction in programming time corresponding to a final programming loop (e.g., programming pulse and program verify operation), a final programming pulse, and the voltage discharge time (e.g., an approximately reduction in programming time of 100 μs.

Advantageously, the updating of the signal to a ready signal value prior to completion of the in-progress programming operation enables the loading of new data for a next programming operation. Accordingly, an overlapping programming operation can be performed following the early release of the cache register. Further details with regards to the operations of program manager 134 are described below.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 134 includes program manager 134, which can implement the all levels programming of memory device 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 119 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 119 to the cache register 118. The cache register 118 and/or the data register 119 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 119 for programming the array of memory cells 150.

In an embodiment, cache register 118 may be omitted, and the data may be written directly into data register 119. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Program manager 134 is in communication with cache register 118. Cache register 118 latches data, either incoming or outgoing, as directed by program 134 to temporarily store data while the array of memory cells 150 is busy writing or reading, respectively, other data. During a programming operation, data is passed from the cache register 118 to data register 119 for transfer to the array of memory cells 150; then new data is latched in the cache register 118 from the I/O control circuitry 112. Status register 122 is in communication with I/O control circuitry 112 and program manager 134 to latch the status information for output to the processor 130.

Status register 122 includes the ready/busy (R/B) register. For example, a 1-bit register could be used to indicate whether the memory device 100 is busy (e.g., that the memory device 130 is performing a memory access operation) or ready (e.g., that the memory device 130 has completed, or is not performing, a memory access operation). Status register 122 may further include a cache ready/busy register. For example, a 1-bit register could be used to indicate whether the cache register 118 is ready to accept new data (e.g., that data has been passed to either the data register 119 for writing to the array of memory cells 150 or to the I/O control circuitry 112). Thus, reading the status register 122, such as by a controller (e.g., local media controller 135), could be used to determine whether the memory device 100 is involved in an access operation or not, e.g., whether or not the memory device is ready to initiate an access operation, or whether the cache register 118 is ready to accept data input. The controller could be an external controller, such as memory sub-system controller 115, or an internal controller, such as local media controller 135 including program manager 134.

In an embodiment, program manager 134 of the can provide the R/B signal to provide an indication to an external controller and/or host system of whether or not the memory device 100 is involved in an access operation or otherwise busy. For example, memory devices often provide a pin (e.g., a pin of control link 132) that is asserted to a logic low, for example, when the device is involved in an access operation and is pulled up to a logic high when the device is again available (e.g., not involved in an access operation). The indication of the ready/busy signal may be dependent upon the access operation being performed by the memory device 130.

Figure 2A:
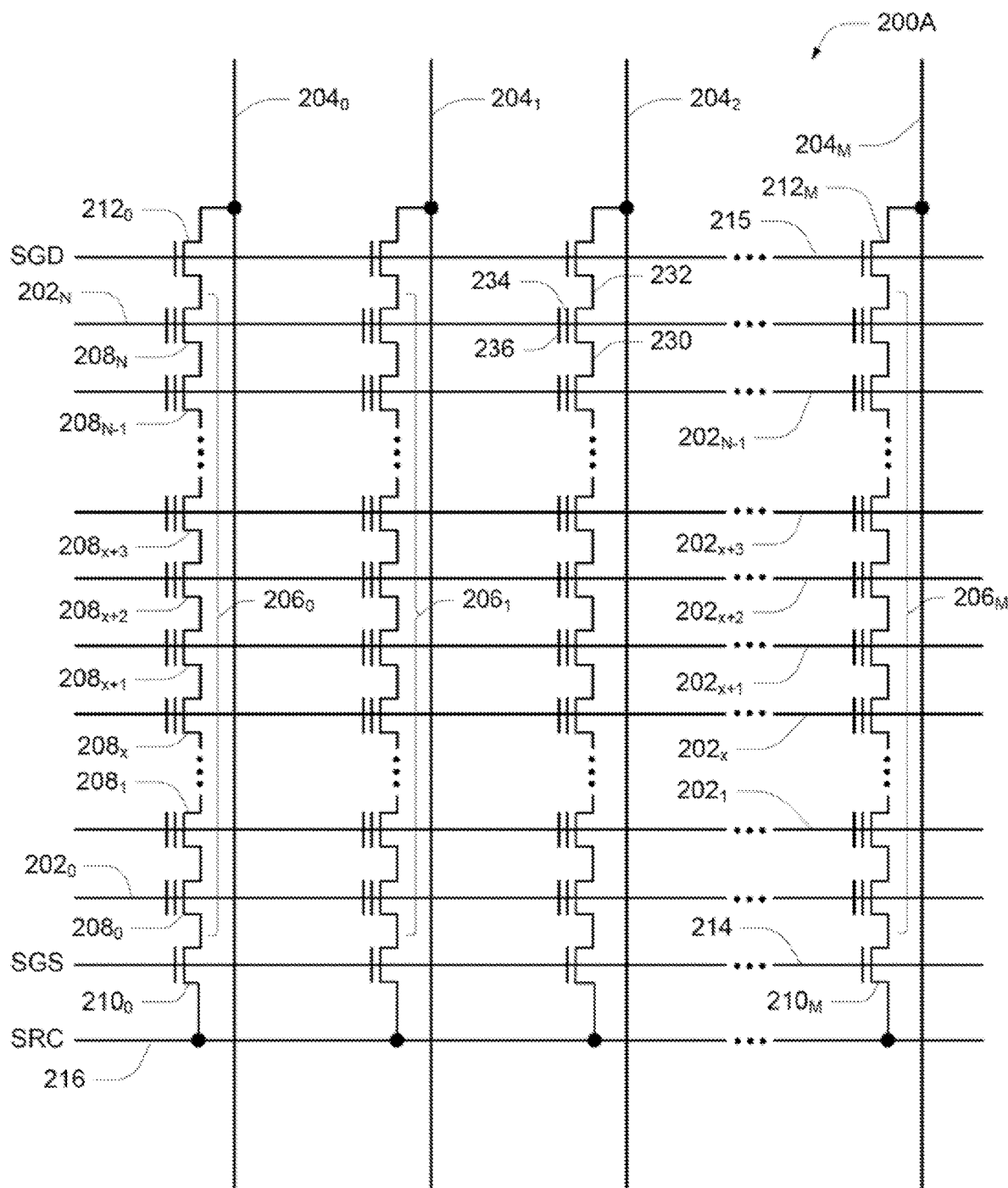
FIG. 2A-2C are schematics of portions of an array of memory cells as could be used in a memory of the type described with reference to FIG. 1B, in accordance with one or more embodiments of the present disclosure.
Figure 2B:
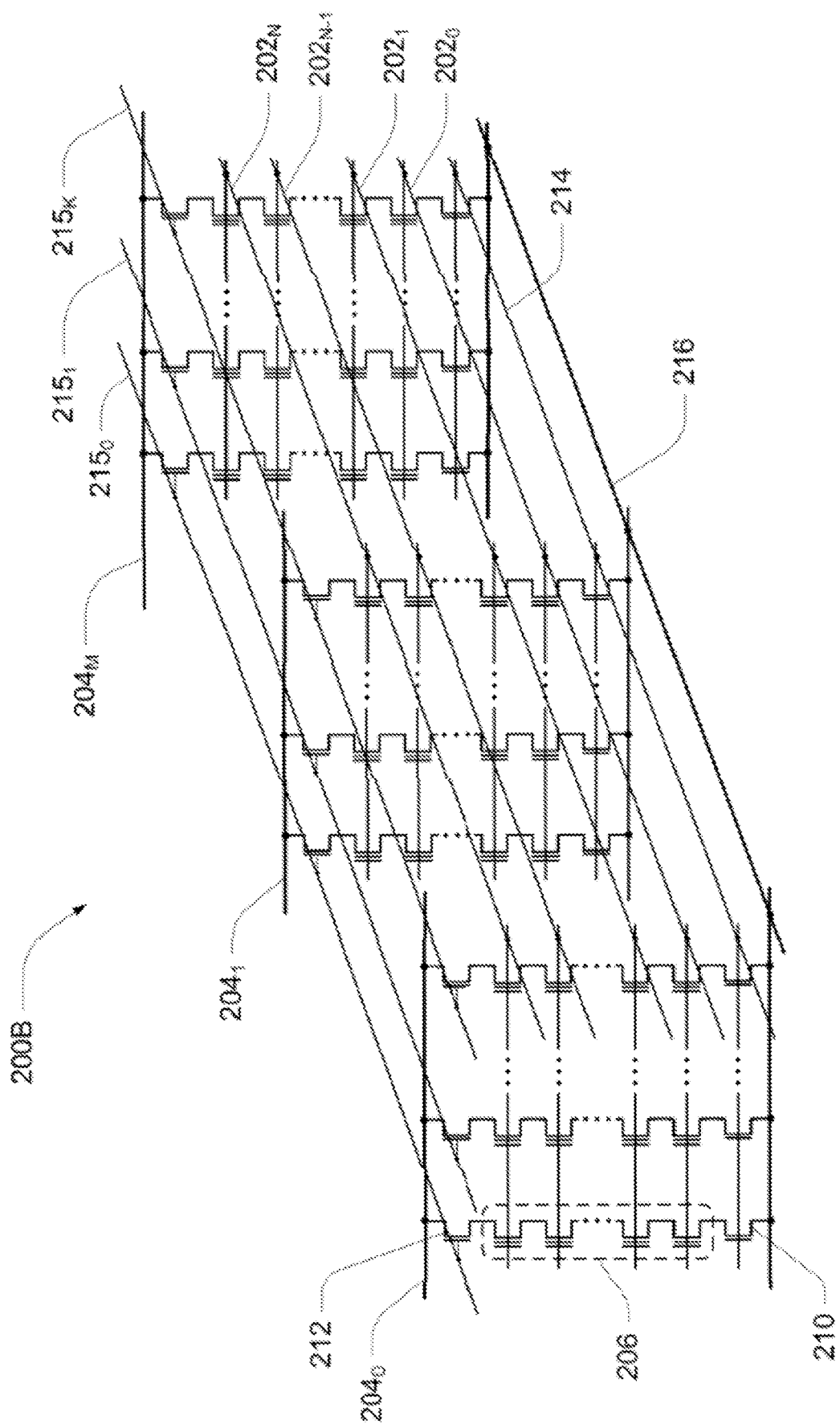
Figure 2C:
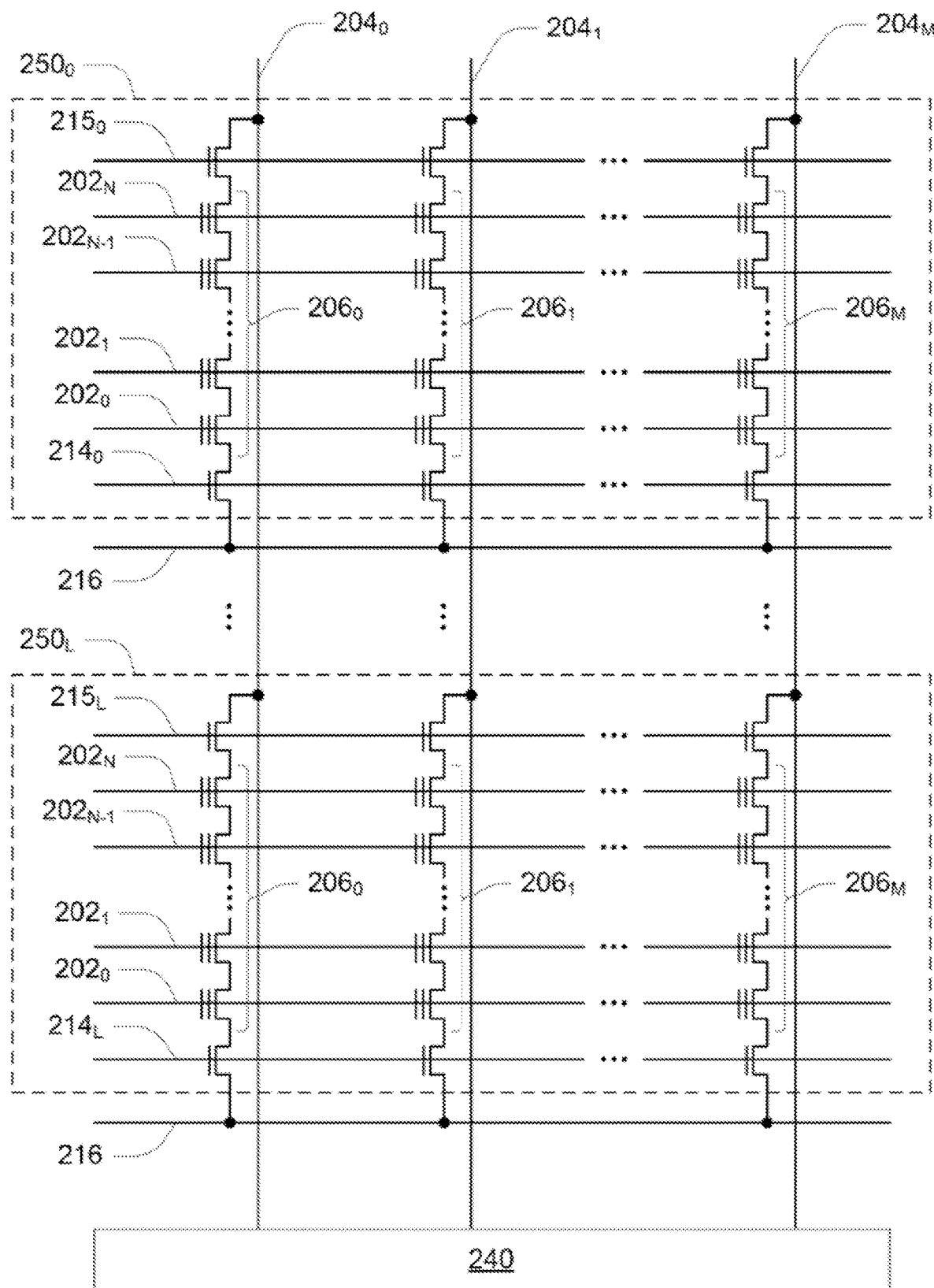

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bitlines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bitline 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to word line $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
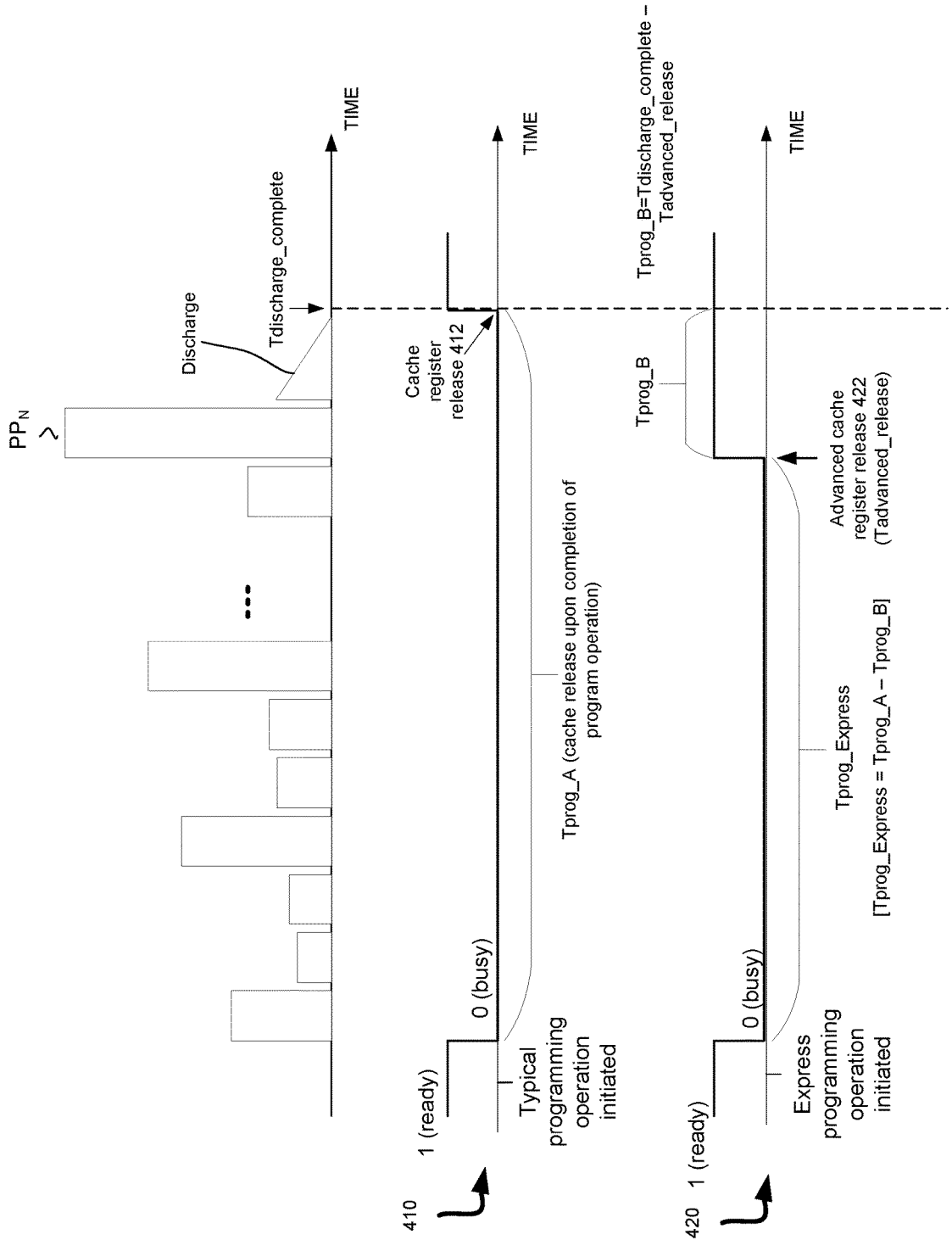
FIG. 4 illustrates a comparison of a first example timeline corresponding to a ready/busy signal representing a status of a cache register associated with the execution of a typical programming operation to program a set of memory cells of a memory device and a second example timeline corresponding to the ready/busy signal representing a status of a cache register associated with the execution of an express programming operation, in accordance with one or more embodiments of the present disclosure.

FIG. 4 illustrates a comparison of a first example timeline 410 corresponding to a ready/busy signal representing a status of a cache register associated with the execution of a typical programming operation to program a set of memory cells of a memory device and a second example timeline 420 corresponding to the ready/busy signal representing a status of a cache register associated with the execution of an express programming operation, in accordance with one or more embodiments of the present disclosure. As shown in FIG. 4, as shown in the timeline 410 associated with the typical programming operation, the cache register release 412 occurs following the completion of the last programming pulse ($PP_N$) and the completion of the voltage discharge phase (e.g., at Tdischarge_complete). As shown in timeline 410, the programming time (Tprog_A) extends from an initiation of the programming operation to a time of the cache register release 412 corresponding to completion of the programming operation (e.g., completion of the programming phase and discharge phase).

In an embodiment, in comparison, as shown in timeline 420 associated with the express programming operation of the present disclosure, the advanced cache register release 422 occurs at a time which is prior to at least the completion of the last programming pulse ($PP_N$) and the completion of the voltage discharge phase (e.g., at Tdischarge_complete). In another embodiment, the advanced cache register release 422 occurs at a time which is prior to the completion of a last programming loop (i.e. programming pulse and program verify operation), a completion of the last programming pulse (i.e., $PP_N$ which follows the last programming loop) and the completion of the voltage discharge phase). As shown in timeline 420, the advanced cache register release 422 of the express programming operation enables a reduction of programming time (Tprog_Express) as compared to Tprog_A of timeline 410). In an embodiment, the programming time reduction of Tprog_B is approximately equal to a duration of time from the advanced cache register release 422 (i.e., Tadvanced_release) and the Tdischarge_complete. In an embodiment, the Tprog_Express (i.e., programming time using the express programming operation) can be presented by the following expression:

$$Tprog\_Express = Tprog\_A - Tprog\_B;$$

where Tprog_A is a first duration of time from the initiation of the express programming operation to a time when the voltage discharge is completed (i.e., Tdischarge_complete), and where Tprog_B is a second duration of time from the advanced cache register release 422 to Tdischarge_complete.

Figure 5:
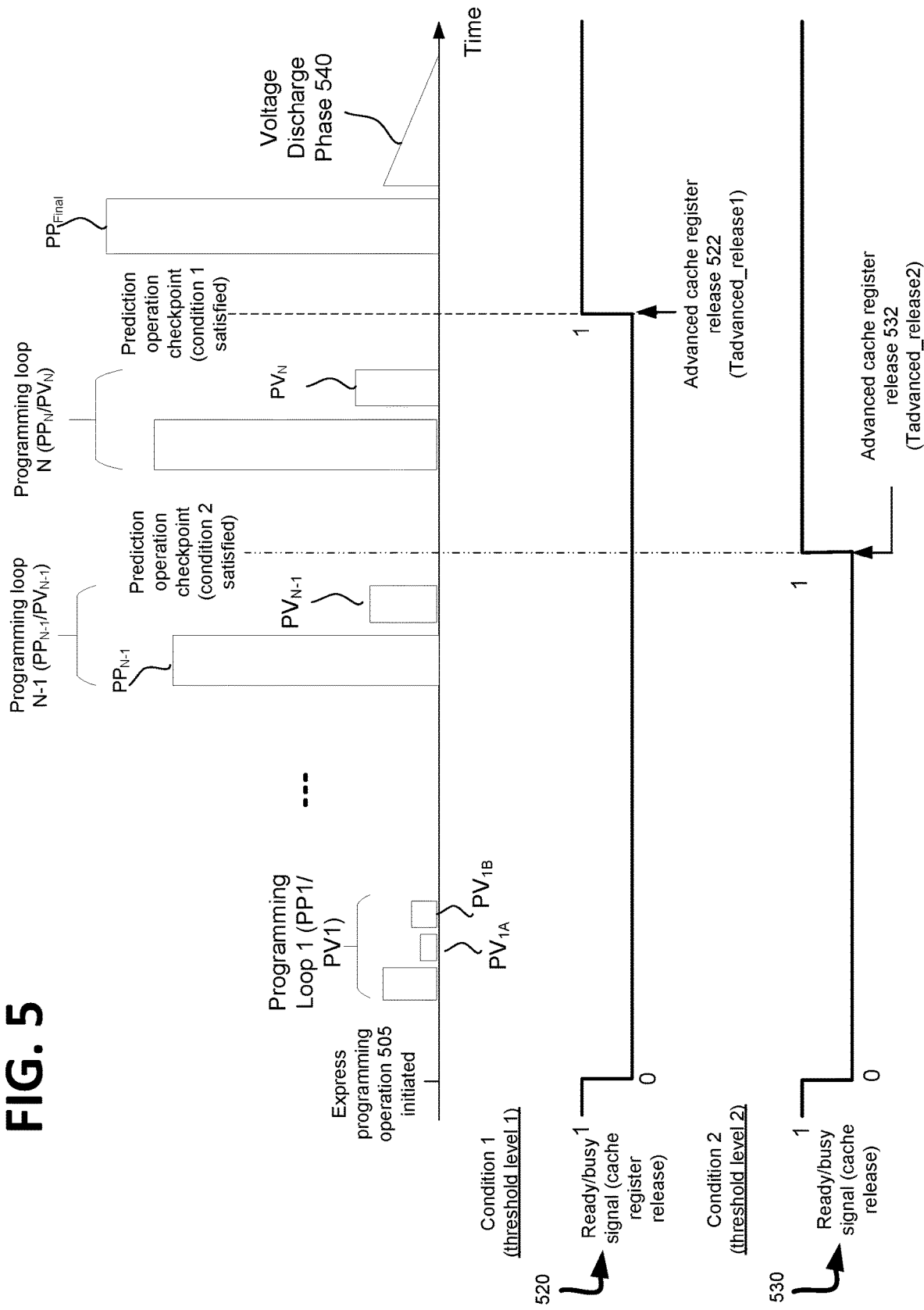
FIG. 5 illustrates example express programming operations and multiple timelines associated with advanced cache register release operations, in accordance with one or more embodiments of the present disclosure

In an embodiment, the advanced cache register release 422 is triggered (at Tadvanced_release) in response to determining satisfaction of a prediction condition, as described in greater detail in FIG. 5.

FIG. 5 illustrates example express programming operations and multiple timelines associated with advanced cache register release operations. As shown in FIG. 5, an express programming operation 505 is initiated. As illustrated, the express programming operation 505 includes a series of programming loops (e.g., programming loop 1 to programming loop N). As shown in FIG. 5, each programming loop can include a program verify operation (PV) that includes a ladder or series of multiple verification voltages (e.g., $PV_{1A}$ and $PV_{1B}$ of PV1 of programming loop 1). In an embodiment, upon initiation of the express programming operation 505, the ready bit is updated from a first bit value (e.g., "1") indicating that the cache register is ready to store new data associated with the programming operation to a second bit value (e.g., "0") indicating that the data has been stored in the cache register and that the cache register is busy and unable to store new data at the current time. In an embodiment, the series of programming loops are performed as part of the express programming operation to program a set of memory cells to a target programming level of a set of programming levels.

In an embodiment, a prediction operation is executed at one or more checkpoints during the express programming operation. In an embodiment, the prediction operation includes a determination of a prediction result representing a predicted level of memory cells for which a program verification status (e.g., pass or fail verification) is known (i.e., established). In an embodiment, the prediction level of memory cells having a known verification status is compared to a threshold level to determine if a condition is satisfied. In an embodiment, the condition is satisfied if the prediction result corresponding to the predicted programming status of the memory cells is greater than or equal to the threshold level. In an embodiment, if the prediction result satisfies the condition, the express programming operation determines that a sufficient level of reliability with respect to the known or established programming status of the memory cells has been achieved.

In an embodiment, in response to determining the condition is satisfied, the advanced release of the cache register is performed (i.e., the early or advanced release of the cache register prior to the completion of all of the programming pulses and the voltage discharge phase 540 of the express programming operation). As shown in FIG. 5, a first example timeline 520 is shown where the prediction operation applies a first threshold level to determine if the prediction condition is satisfied the prediction operation checkpoint.

FIG. 5 illustrates a second example timeline 530 where the prediction operation applies a second threshold level. For example, the second threshold level can be a metric representing a number of cells left to be programmed. It is noted that the threshold level can be established in view of a desired or target BER level (or other reliability metric) and can have any desired value. In an embodiment, if a higher level of reliability is desired with respect to the prediction operation, the first threshold level can be used to determine if condition 1 is satisfied. If, in another example, a relatively lower level of reliability is desired with respect to the prediction operation (i.e., as compared to the prediction operation using condition 1), the second threshold level can be used to determine if condition 2 is satisfied.

In an embodiment, the prediction operation can be performed at any number of checkpoints corresponding to the express programming operation. For example, a first checkpoint for the prediction operation can be established after programming loop N−5 (where N equals a predicted or average number of programming loops used to complete the programming operation), a second checkpoint for the prediction operation can be established after programming loop N−4, and so on. In an embodiment, at each of the one or more checkpoints, the prediction operation is performed and a determination is made whether the prediction result satisfies the condition (i.e., whether the prediction result exceeds the applicable threshold level).

In an embodiment, the prediction result represents a number, quantity, percentage, amount, etc. of memory cells that, based on a prediction, will either pass or fail program verification in a current programming loop. In response to determining the prediction result satisfies the condition (e.g., condition 1 associated with threshold level 1 of timeline 520 or condition 2 associated with threshold level 2 of timeline 530), the cache register is released and new data can be loaded into the cache register (e.g., advanced cache register release 522 of example timeline 520 or advanced cache register release 532 of example timeline 530).

In an embodiment, the prediction operation can include a predictive count fail byte (CFBYTE) operation. In an embodiment, the predictive CFBYTE operation determines a number of memory cells that would pass or fail verification in a current programming loop. In this embodiment, the prediction operation can determine the number of the memory cells based at least in part on information from a previous program loop. The previous program loop is executed prior to the current program loop. In an embodiment, the predictive CFBYTE operation determines a count of an expected number of memory cells exceeding a threshold voltage value (e.g., the prediction result) and compares that prediction result to an applicable threshold level (e.g., threshold level 1 in the first example shown in FIG. 5) or threshold level 2 in the second example shown in FIG. 5). According to embodiments, other prediction operation can be performed to generate a prediction result to determine if the condition is satisfied such that the advanced release of the cache register can be initiated.

FIG. 5 illustrates two examples (e.g., a first example in timeline 520 and a second example in timeline 530) which apply different threshold levels during the prediction operation to determine if a corresponding condition is satisfied. In an embodiment shown in timeline 520, the threshold level for the prediction operation is tuned to threshold level 1 corresponding to a first target or desired reliability level (e.g., a reliability level corresponding to a first desired or target BER). In an embodiment shown in timeline 530, the threshold level for the prediction operation is tuned to threshold level 2 corresponding to a second target or desired reliability level (e.g., a reliability level corresponding to a second desired or target BER that it is different than the first target BER). In an embodiment, the express programming operation can include the tuning or adjustment of the threshold level of the prediction operation (e.g., adjusting from threshold level 1 to threshold level 2 or vice versa) in view of BER measurements associated with one or more previously executed express programming operations. For example, if a first express programming operation using threshold level 2 results in a first BER level that is considered too high (e.g., based on a target or threshold BER level), the processing logic can dynamically adjust or change to threshold level 1 during the execution of a subsequent express programming operation.

Advantageously, as shown in FIG. 5, in the example shown in timeline 520, in response to the satisfaction of condition 1 as a result of a prediction operation, the advanced cache register release 522 is triggered prior to both the final programming pulse (e.g., $PP_{final}$) and the voltage discharge phase 540. The triggering of the advanced cache register release 522 prior to completion of all of the programming pulses and the voltage discharge phase 540 results in a reduction of the programming time as compared to typical programming operation which only release the cache register following all of the programming pulses and the discharge phase.

Furthermore, as shown in FIG. 5, in the example shown in timeline 530, in response to the satisfaction of condition 2 as a result of a prediction operation, the advanced cache register release 532 is triggered at a time that is prior to both a final programming loop (e.g., programming loop N), a final programming pulse (e.g., $PP_{final}$), and completion of the voltage discharge phase 540. In an embodiment, the releasing of the cache register and storing of new data associated with a next express programming operation overlaps with at least a portion of the current or in-progress express programming operation. Accordingly, the triggering of the advanced cache register release 532 results in a reduction of the programming time as compared to typical programming operation and enables new data (e.g. data associated with a next express programming operation) to be stored in the cache register at Tadvanced_release2, while the in-progress express programming operation 505 completes.

Figure 6:
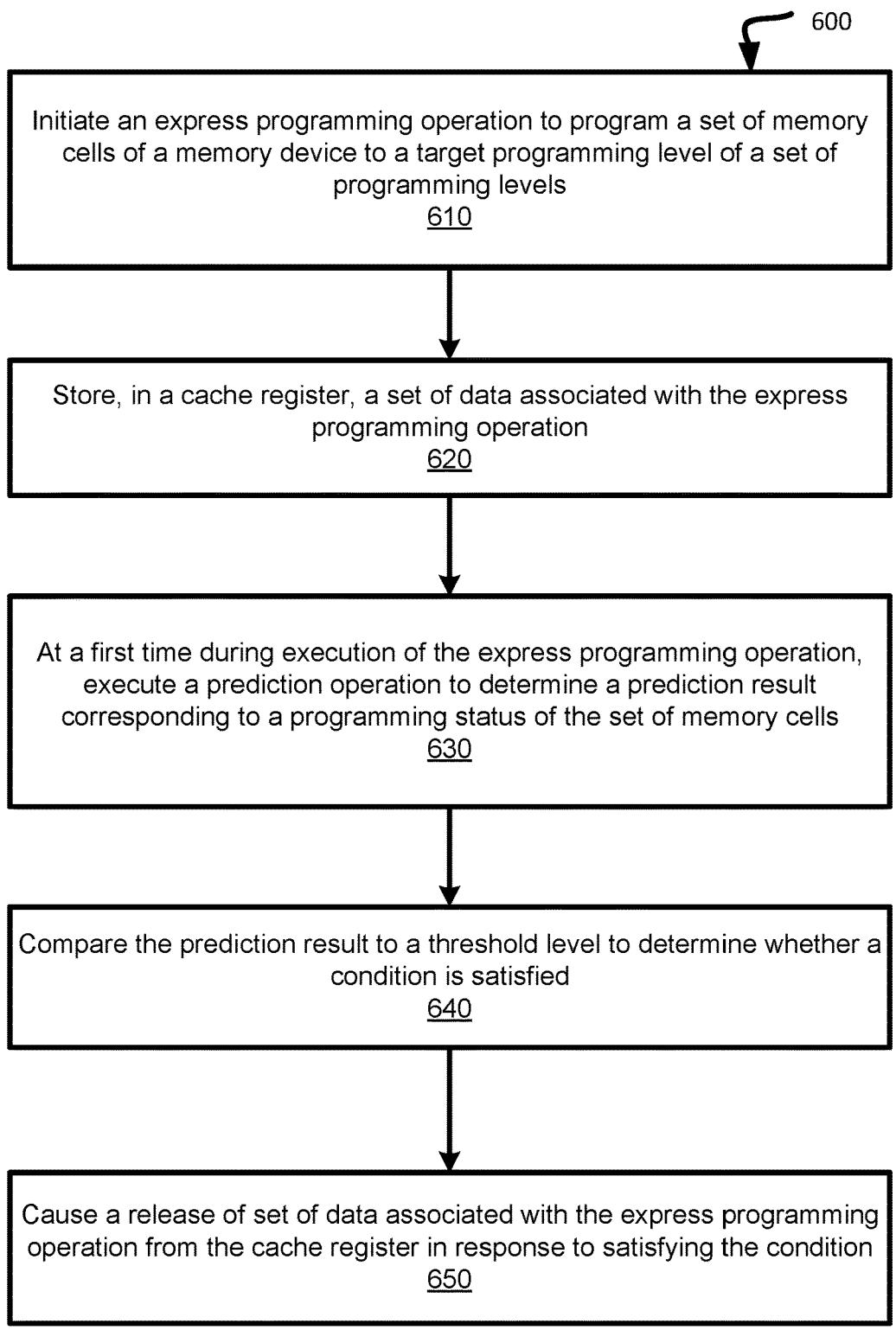
FIG. 6 is a flow diagram of an example express programming operation with advanced cache register release, in accordance with one or more embodiments of the present disclosure.

FIG. 6 is a flow diagram of an example method 600 of an express programming operation to program a set of memory cells of a memory device in a memory sub-system in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by program manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, an operation is initiated. For example, processing logic (e.g., program manager 134) can initiate an express programming operation to program a set of memory cells of a memory device to a target programming level of a set of programming levels. In one embodiment, the express programming operation includes a set of programming loops (e.g., iterations of incrementally increasing programming pulses and program verify operations, such as Programming Loop 1 to Programming Loop N of FIG. 5), a final or last programming pulse (e.g., $PP_{Final}$ of FIG. 5), and a voltage discharge phase (e.g., discharge phase 540 of FIG. 5) used to program the set of memory cells to the target programming level (e.g., L1, L2 . . . L7 for a TLC memory device; wherein L0 is an erase state). In an embodiment, the express programming operation is directed to one or more specific memory cell addresses. In one embodiment, the processing logic can identify the set of memory cells (e.g., a subset of the memory cells of memory array 150 of FIG. 1B, such as those memory cells associated with a certain wordline or multiple wordlines of memory array 150). In one embodiment, the set of memory cells are configured as MLC memory (e.g., any type of memory cells that store more than one bit per cell including 2 bits, 3 bits, 4 bits, or more bits per cell). In an embodiment, a command used to initiate the express programming operation is associated with a set of physical or logical addresses corresponding to the set of memory cells to be programmed. In an embodiment, the processing logic identifies the set of memory cells based on the set of addresses provided as part of the command.

At operation 620, data is stored. For example, the processing logic can store, in a cache register, a set of data associated with the programming operation. In an embodiment, the cache register stores the data and a ready bit (e.g., the RB pin) of the cache register representing the status of the cache register is set to a "busy" bit value (e.g., the bit is set to "0", as shown in timeline 420 of FIG. 4 and timelines 520 and 530 of FIG. 5). In an embodiment, when the cache register is set to the busy bit value, the cache register is being used to store data associated with the in-progress programming operation (i.e., the express programming operation initiated in operation 610).

At operation 630, a result is determined. For example, the processing logic can, at a first time during execution of the express programming operation, execute a prediction operation to determine a prediction result corresponding to a programming status of the set of memory cells. In an embodiment, the prediction result represents a level (e.g., amount, percentage, ratio, etc.) of the set of memory cells for which a programming status (e.g., a pass verification status or fail verification status) will be known or established during a current programming loop. In an embodiment, the prediction operation can be performed at one or more checkpoints during the express programming operation (e.g., after programming loop X−1, after programming loop X, after programming loop X+1, etc., where X is any non-zero integer). For example, the prediction operation can be performed after programming loop X−1, such that the prediction result provides a predicted level of the set of memory cells that will have a known or established programming status (e.g., either a pass or fail status) at the completion of programming loop X. In this example, the prediction result representing the level of known programming status for the current programming loop (e.g., programming loop X) is based at least in part on the programming status identified with respect to the one or more previous programming loops (e.g. programming loop X−1). In an embodiment, the prediction operation can be a predictive CFBYTE operation. In an embodiment, for example, the predication operation can implemented by measuring a precharge current associated with a program verify operation, such that if the precharge current during the program verify operation is reduced, a predication can be made that the programming is near completion.

At operation 640, a comparison is made. For example, the processing logic can compare the prediction result to a threshold level to determine whether a condition is satisfied. In an embodiment, the threshold level can represent an acceptable level of the predicted status such that the condition is satisfied when the prediction result is greater than or equal to the threshold level. For example, the threshold level can be a percentage of the set of memory cells for which the predicted programming status is known. For example, the prediction result (e.g., a first percentage of the set of memory cells that have a predicted programming status with respect to the target programming level that is known based on the prediction operation) is compared to the second percentage (e.g., Y percent) of the threshold level, where the condition is satisfied if the first percentage is greater than or equal to the second percentage. In an embodiment, the prediction result can be based on a determination of a number of memory cells having an unprogrammed status and information identifying an average number of memory cells that pass for every programming pulse. In an embodiment, a number of cells to be programmed (e.g., a number of unprogrammed cells) is measured and is compared to a threshold number to determine if a condition is satisfied. In an embodiment, the condition is satisfied when the number of unprogrammed cells is than a maximum acceptable value.

In an embodiment, the threshold level can be established based at least in part on a desired or target BER level or other reliability metric. In an embodiment, the threshold level can be established or dynamically tuned in view of a reliability metric (e.g., BER) associated with the memory sub-system. For example, a BER level can be determined based on the execution of a first express programming operation and that BER level can be used to adjust or tune the threshold level associated with the prediction operation of a next or second express programming operation.

At operation 650, a cache register is released. For example, the processing logic can cause a release of the cache register in response to satisfying the condition. In an embodiment, when the condition is met, the processing logic can release the cache register (i.e., the advanced cache register release) to enable new data associated with a new or next express programming operation to be stored. In an embodiment, in response to the satisfaction of the condition, the ready bit value can be set to the "ready" status level (e.g., "1" as shown in FIG. 5 in connection with the advanced cache register release 522 and 532 of timelines 520 and 530, respectively. In an embodiment, the ready bit value of "1" signals to an external controller and/or a host system that new data can be loaded into the cache register in connection with the execution of a new or next express programming operation. Advantageously, the advanced cache register release of operation 650 can be performed at a time prior to the completion of the current or in-progress express programming operation. In an embodiment, the advanced cache register release of operation 650 can occur prior to both a final programming pulse (e.g., $PP_{Final}$ of FIG. 5) and the voltage discharge phase 540. In an embodiment, the advanced cache register release of operation 650 can occur prior a final programming loop (e.g., programming loop N of FIG. 5), a final programming pulse (e.g., $PP_{Final}$ of FIG. 5) and the voltage discharge phase (e.g., voltage discharge phase 540 of FIG. 5). In an embodiment, the advanced cache register release in response to satisfaction of the condition associated with the prediction operation can occur at a time that is approximately 50 μs to 100 μs prior to completion of the current express programming operation.

Figure 7:
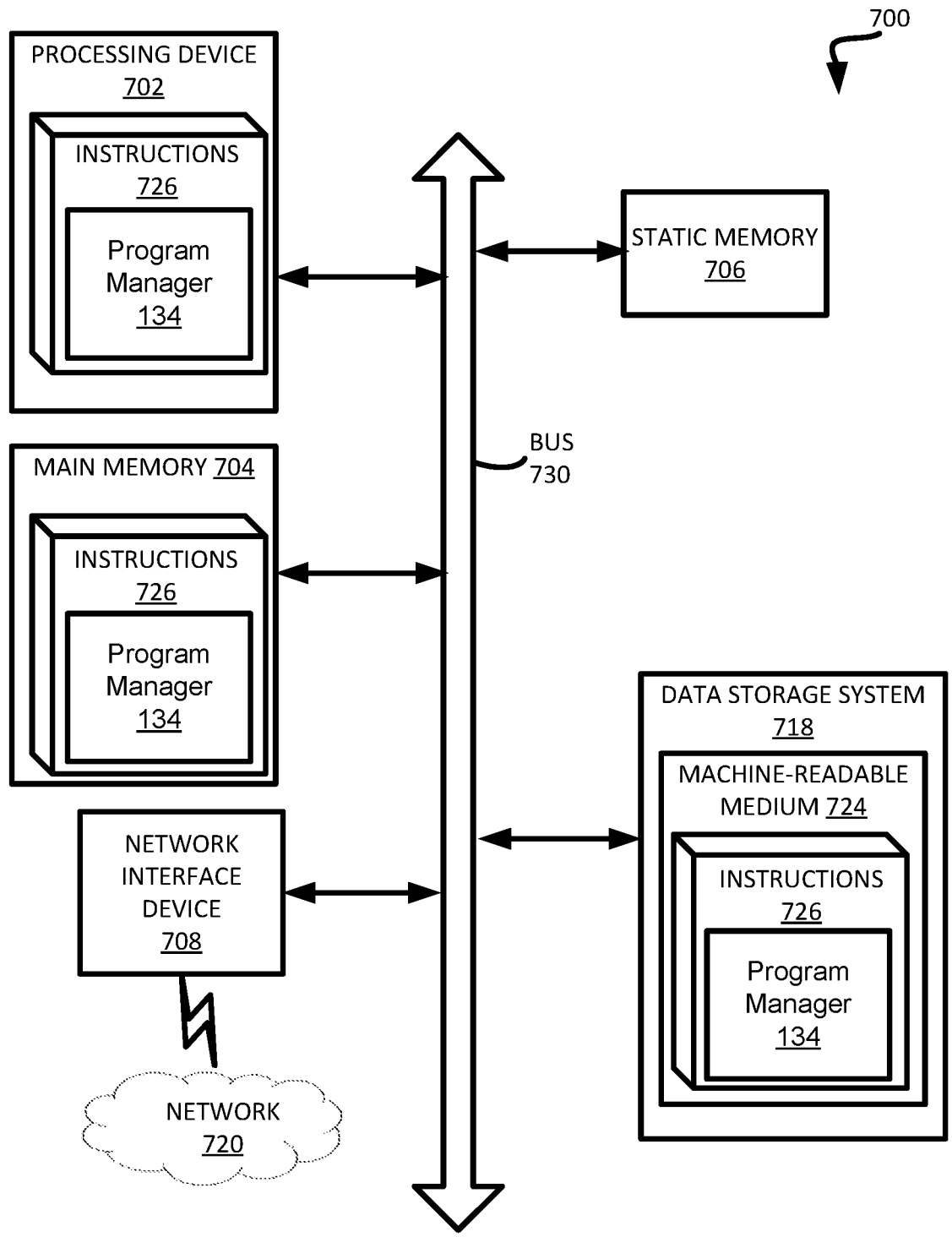
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 70 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to program manager 134 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a set of memory cells; and
control logic, operatively coupled with the memory array, to perform operations comprising:
initiating a programming operation to program the set of memory cells to a target programming level of a set of programming levels;
during execution of the programming operation, determining a programming status associated with the set of memory cells; and
in response to determining the programming status satisfies a condition, causing a release of a set of data associated with the programming operation from a cache register.

2. The memory device of claim 1, the operations further comprising storing, in the cache register, the set of data associated with the programming operation.

3. The memory device of claim 1, wherein the programming status comprises a prediction of a quantity of the set of memory cells associated with a first programming status.

4. The memory device of claim 1, wherein the condition is satisfied if the programming status comprises a predicted quantity of the set of memory cells that is greater than or equal to a threshold level.

5. The memory device of claim 1, the operations further comprising:
updating a signal associated with the cache register from a busy status to a ready status in response to the condition being satisfied; and
in view of the ready status, loading, into the cache register, a next set of data associated with a next express programming operation being applied to the memory array.

6. The memory device of claim 1, wherein the set of data is released from the cache register at a time prior to completion of the programming operation.

7. The memory device of claim 1, wherein the set of data is released from the cache register at a time prior to one or more programming pulses and a voltage discharge phase associated with the programming operation being applied to the memory array.

8. The memory device of claim 1, wherein the set of data is released from the cache register at a time prior to one or more programming loops, a final programming pulse and a voltage discharge phase associated with the programming operation.

9. The memory device of claim 8, the operations further comprising initiating execution of a subsequent programming operation based on an additional set of data stored in the cache register prior to completion of the programming operation.

10. A method comprising:
 initiating a programming operation to program a set of memory cells of a memory device to a target programming level of a set of programming levels;
 during execution of the programming operation, determining a programming status associated with the set of memory cells; and
 in response to determining the programming status satisfies a condition, causing a release of a first set of data associated with the programming operation from a cache register.

11. The method of claim 10, wherein the programming status is determined at a checkpoint associated with the programming operation.

12. The method of claim 11, wherein the checkpoint is established following one or more programming loops of the programming operation, wherein each of the one or more programming loops comprises application of a programming pulse and execution of a program verify operation.

13. The method of claim 10, further comprising loading, into the cache register, a second set of data associated with a subsequent programming operation.

14. The method of claim 13, wherein the second set of data is loaded into the cache register prior to completion of the programming operation.

15. The method of claim 10, further comprising updating a signal associated with the cache register from a busy status to a ready status in response to the condition being satisfied.

16. The method of claim 10, wherein the first set of data is released from the cache register prior to completion of the programming operation.

17. A memory sub-system comprising:
 a memory device comprising a set of memory cells; and
 control logic, operatively coupled to the memory device, the control logic to perform operations comprising:
  initiating a programming operation to program the set of memory cells to a target programming level of a set of programming levels;
  during execution of the programming operation, determining a programming status associated with the set of memory cells; and
  in response to determining the programming status satisfies a condition, causing a release of a set of data associated with the programming operation from a cache register.

18. The memory sub-system of claim 17, wherein the programming status comprises a prediction of a quantity of the set of memory cells associated with a first programming status.

19. The memory sub-system of claim 17, wherein the condition is satisfied if the programming status comprises a predicted quantity of the set of memory cells that is greater than or equal to a threshold level.

20. The memory sub-system of claim 17, the operations further comprising:
 updating a signal associated with the cache register from a busy status to a ready status in response to the condition being satisfied; and
 in view of the ready status, loading, into the cache register, an additional set of data associated with a subsequent programming operation.

\* \* \* \* \*